United States Patent [19]

Hayashi et al.

[11] Patent Number: 4,818,867

[45] Date of Patent: Apr. 4, 1989

[54] OPTICAL INFORMATION PROCESSING DEVICE USING OPTICAL SHUTTER ELEMENTS

[75] Inventors: Yutaka Hayashi, Ibaragi; Seiichi Ishihara; Hisato Hiraishi, both of Tokorozawa, all of Japan

[73] Assignees: Agency of Industrial Science and Technology; Ministry of International Trade and Industry; Citizen Watch Co., Ltd., all of Tokyo, Japan

[21] Appl. No.: 78,421

[22] Filed: Jul. 27, 1987

[30] Foreign Application Priority Data

Jul. 29, 1986 [JP] Japan .................................. 61-178522

[51] Int. Cl.$^4$ .............................................. G01D 5/34
[52] U.S. Cl. .................................... 250/229; 250/212; 250/209
[58] Field of Search ............... 250/229, 208, 209, 212; 350/332, 342; 364/713, 822, 837

[56] References Cited

U.S. PATENT DOCUMENTS 3,270,187  8/1966  Fomenko .......................... 364/713
3,612,847 10/1971  Jorgensen ......................... 364/713
3,996,455 12/1976  Schaefer et al. .................. 364/713

Primary Examiner—David C. Nelms
Attorney, Agent, or Firm—Jordan and Hamburg

[57] ABSTRACT

An optical information processing device includes a light receiving and driving circuit including photo voltaic elements adapted to receive an incident light and to produce a drive voltage, and an optical shutter driven by the drive voltage produced by the light receiving and driving circuit. With this structure, various basic logical operations are performed by the device according to the present invention. As a feature of the invention, the device receives a pair of incident lights having a complementary relation in strength with each other and produces a pair of output lights from the optical shutters which also are complementary in strength with each other. Thus, the possibility of errors in logical operations is greatly reduced.

18 Claims, 12 Drawing Sheets

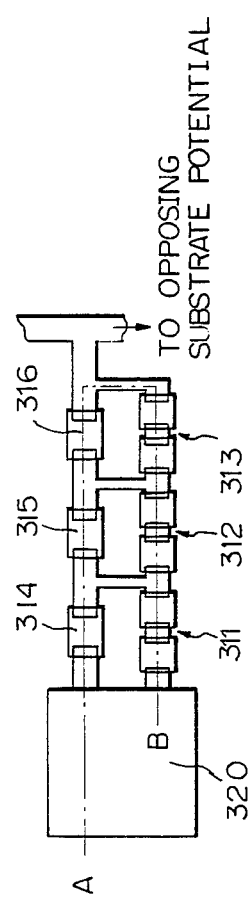
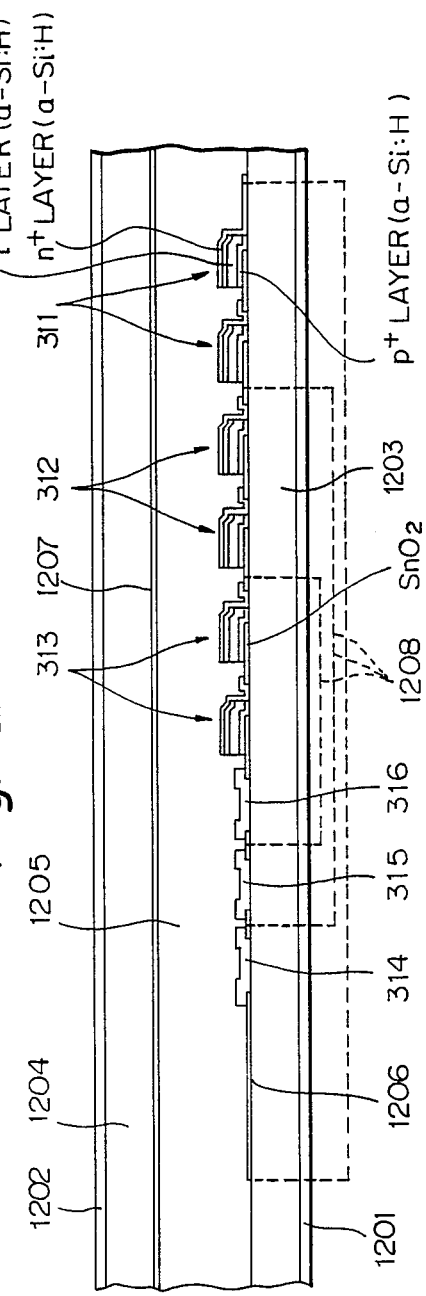
Fig. 12(a)
Fig. 12(b)

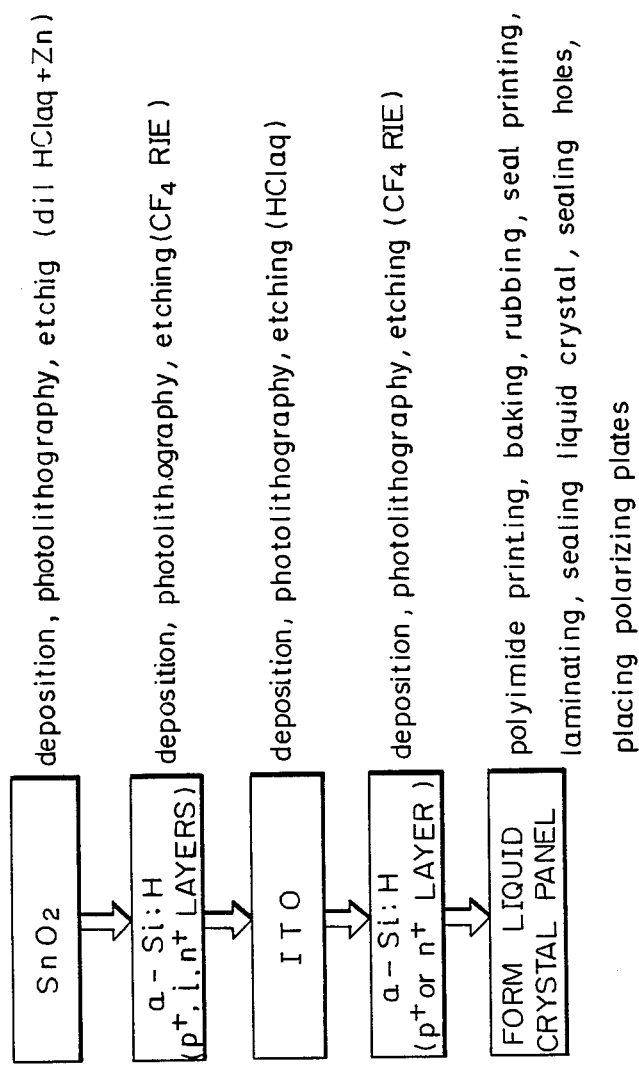

OPTICAL INFORMATION PROCESSING DEVICE USING OPTICAL SHUTTER ELEMENTS

BACKGROUND OF THE INVENTION

1. Field of the Invention

The present invention generally relates to optical information processing, and more specifically to information processing device using an optical shutter elements, and an optical logic device using an optical shutter elements.

2. Description of Background Information

In the field of optical information processing, analog type optical parallel processing originated from the invention of holography has reached the stage of practical application. The analog type optical parallel processing is applied mainly for picture information processing in various factory production lines. In such applications, there however is a serious limitation that a different and rather complex optical system is required separately for each of the objects of the application. On the other hand, combination of image input using a solid image pickup element and image processing by means of a computer has made rapid progress owing to the advancement of the device technology. Because of these reasons, the analog type optical parallel processing is gradually losing its role. Moreover, in view of the limitation in the accuracy of the analog processing, and for effectively utilizing the knowledge of electronics which has been accumulated for a long period, digital type optical information processing is now acquiring much interest in this field.

On the other hand, a major advantage inherent in the optical information processing and which has been pursued therewith is its fast speed characteristic as compared with conventional electronic circuits. Besides, the elimination of electro-magnetically induced noises can be expected by the use of optics.

Research of the digital type optical information processing is taking place on the basis of the above mentioned fundamentals. The optical information processing is divided into two sorts of techniques, namely, time series processing and optical parallel processing. Specifically, the optical digital time series processing has been developed, aiming at the replacement of switching elements typically represented by transistors in electronic circuits of conventional integrated circuits with optical shutters having ultra high speed, thus replacing electrons with photons as a driving medium. Furthermore, the development of the time series processing has a target to take over the architecture of conventional electronic circuits as it is, and to realize very high speed operations. As an example of the optical shutter used for this purpose, a crystal having non-linear type photo responsive refractive index was applied to the Fabry-Perot interferometer by E. Abraham et al. (E. Abraham et al., Scientific American, Feb. 63 (1983)). In this application, a switching speed having the order of $10^{-12}$ S has been attained.

On the other hand, the optical parallel processing is targeted to accomplish a high operation speed by means of a high speed processing of multiple input type optical information such as image input or by the parallel processing of operations executed in usual computers. In this case, an operation speed value obtained by dividing the speed of optical shutter by the number of parallel processing corresponds to the speed of optical shutters in the above mentioned time series processing. This means that the ultra high speed optical shutter is not necessarily required, and the integration density and the easiness in constructing a logical operation device become very important factors. Especially, in the processing of image input, the high density integration of the optical shutter becomes important because the number of light receiving parts and optical shutters determines the resolution of image because it corresponds to the number of picture elements in usual display panel, and determines the resolution of the picture. Therefore, the integration scale of elements such as optical shutters may be a more important factor.

As an example of application of the parallel processing, a type of digital parallel processing is proposed by Seko (A. Seko, Applied Physics 53, 409 (1984)). The purpose of this application by Seko is to evaluate a pattern matching between an input image and a reference image. To this end, an exclusive OR signal of both images is generated and outputted as a light output. The structure used for generating the exclusive OR signal is as follows: at first each of the input image and the reference image is separated into two of the same images by a light branching operation. One of the thus obtained two images is inverted respectively to provide an inverted image of the input image and an inverted image of the reference image. These inverted images of the input image and the reference image are then combined with the remaining reference image and the input image produced by the light branching operation, so as to provide logical products. The above mentioned optical exclusive OR signal is obtained by combining these logical products, to produce a logical sum. Each stage of the inversion, generation of a logical product, and generation of a logical sum is performed by a two-dimensional optical information processing device in which optical logic elements having a respective one of these functions are arranged in the form of a two-dimensional array. To provide a total system, a plurality of the two-dimensional optical information processing devices are arranged in series manner.

The two-dimensional optical information processing device is, for example, presented by an integration of optical fibers (A. Seko et al., Applied Optics, 18, 2052 (1979)). However, in view of its readiness for integration and form production, devices using liquid crystal are considered most promising. As an example, a two-dimensional optical, information processing device in which a photo conductive is introduced in a liquid crystal panel is proposed (R. A. Athale et al. Optical Eng., 18, 513 (1979)).

FIG. 15 shows the structure of optical logic elements in the prior art optical information processing device by Athale et al. In actual arrangement, these elements are arranged in two-dimensional manner, to form a two-dimensional array, and the liquid crystal layer is provided in combined form and formed in succession.

The structure of this optical logic device is as follows. The device comprises clear electrodes 1510, 1520, and 1530, a photo conductive layer 1540, and a transparent layer 1550, and a liquid crystal 1560. In order to obtain a desirable operation of the device, a polarizing plate is suitably combined with the liquid crystal so that the liquid crystal transmits a light incident there upon when a sufficient voltage is applied, and it does not transmit the light when the applied voltage is lower than a threshold level. The operation of the device is as follows. Under application of the above mentioned voltage whose level is higher than the threshold level across the clear electrodes 1510 and 1530, when an incident light 1570 is not present, the photo conductive layer 1540 exhibits a high resistance state, and for the most part of the voltage applied across the clear electrodes 1510 and 1530 is absorbed by a voltage drop at the photo conductive layer so that almost no voltage is applied to the liquid crystal layer 1560. Therefore, even if there is another incident light 1580, a level of an output light 1590 will be equal to zero. On the other hand, when the incident light 1570 is present, the photo conductive layer 1540 becomes conductive, to control the potential of the clear electrode 1520 to be equal to the potential of the clear electrode 1510. In this state, the liquid crystal layer 1560 is applied with a voltage higher than the threshold level and the output light 1590 will be generated when another incident light is supplied. In addition, the above explained operation of the device can be reversed by changing the arrangement of the polarizing plate, so that the output light will not be generated when the incident light 1570 is present.

The above described operation is summarized such that the output light 1590 is generated only when both of incident lights are present. This means that a logical product (AND) of two incident lights is obtained. Furthermore, by changing the arrangement of the polarizing plate, other logical operations such as an inversion (NOT) can be obtained.

However, with this prior art optical logic device, there are several limitative conditions which make it difficult to provide a two-dimensional optical information processing system having enough freedom of design and is sufficiently reliable.

The problems with the conventional device are as follows.

1. It is general to arrange several two-dimensional optical information processing elements in a serial manner such as in the structure used in the pattern matching of Seko. With this type of structure, light outputs from different layers are attenuated differently depending on the number of layers each light has passed. Therefore, the level of the output light will have various levels, and causing an increase in the possibility of malfunctions.

2. It is not possible to provide an operation for generating a logical product among more than two inputs.

3. Logical sum (OR) operation can be attained if only transparent layers are used in the device, i.e., without the use of the photo conductive layer. However, in such a case, output signals will have several different levels, and it is very likely to cause malfunctions as in the above mentioned problem 1.

4. Logical inversion can be attained, as mentioned before, by arranging the polarizing plate suitably. However, in practice, in a structure including a plurality of optical logic devices shown in FIG. 15 are arranged in a single liquid crystal panel, it becomes necessary to put polarizing plates on the liquid crystal corresponding to each logical element in a mosaic form in order to provide functions of logical product and logical inversion in the same structure. This is a quite difficult task in producing a high density optical logic element.

5. In a multilayer structure arrangement mentioned in connection with the above point 1, a portion of the device in which the photo conductive layer is disposed is not transparent. This means that the transparent portion of the device decreases as the number of layers increases, and this is an obstacle to the production of a highly integrated structure.

OBJECT AND SUMMARY OF THE INVENTION

An object of the present invention is to provide an optical information processing device and an element for such a device in which the problems experienced in the conventional optical information processing devices are overcome.

According to the present invention, an optical shutter type information processing device comprises a pair of structures each having a light receiving and driving circuit which operates with an incident light beam, and an optical shutter driving by the light receiving and driving circuit. When a complementary relationship exists between one incident light and the other incident light, the device detects the intensities of lights which are complementary to each other and controls optical shutters so as to produce a pair of output lights which are also complementary to each other.

In this way, malfunction of the logical element against the level change of output light is prevented. Moreover, an optical shutter type information processing device according to the present invention has a structure in which the light receiving and driving circuit receives a plurality of incident lights, and performs a logical operation to obtain a logical product, a logical sum, or a logical inversion to provide a drive voltage which in turn is supplied to the optical shutter. This type of structure according to the present invention is characterized in that there is no limitation of the number of input lights, i.e., the number of inputs of the logical operation, and the intensity level of the output light does not vary greatly depending on the sort of logical operation. Furthermore, the structure according to the present invention is very advantageous in that the logical inversion operation is attained without the necessity of arranging the polarizing plates in mosaic form. In this way, the facility in constructing a structure for logical operations is very much improved as compared with the conventional technique. Moreover, when two-dimensional optical information processing devices are to be connected (laminated) in series with each other, a light input to a light receiving and driving circuit of a two-dimensional optical information processing device does not reach the next layer which includes another two-dimensional optical information processing device because the light receiving and driving circuit is not transparent. This forms an obstacle in designing a highly integrated structure. According to another feature of the present invention, a light regenerating layer is inserted between two layers each forming the two-dimensional optical information processing device, thereby a regenerated light to be applied to the two-dimensional optical information processing device of the next layer is provided at locations where the first incident light is extinguished.

BRIEF DESCRIPTION OF THE DRAWINGS

FIG. 12(a) is a plan view of an arrangement according to the present invention, in which a three input AND circuit as shown in FIG. 3 is formed as an actual device;

FIG. 12 (b) is a sectional view of the element shown in FIG. 12(a);

FIG. 13 is a flowchart showing the process for producing the device shown in FIGS. 12(a) and 12(b);

DETAILED DESCRIPTION OF THE PREFERRED EMBODIMENTS

Referring to accompanying drawings, the preferred embodiments of the present invention will be explained hereinafter.

Figure 1:
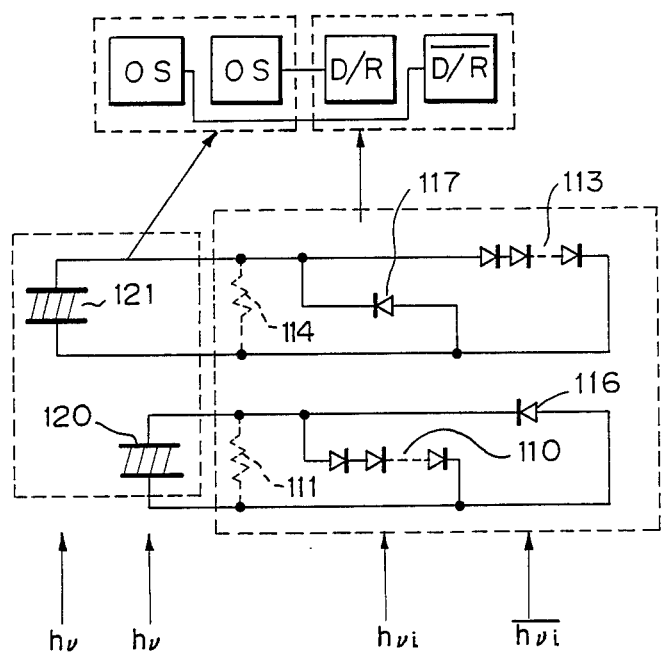
FIG. 1 is a circuit diagram of an embodiment of a device using complementary input lights according to the present invention.

FIG. 1 illustrates the construction of a device using complementary input lights according to the present invention. This device is made up of a light receiving and driving circuit including thin film photo voltaic elements 117, 113, 116, and 110 formed on a transparent substrate and discharging resistors 114 and 111, and optical shutters 120 and 121. Through the description of the specification, when illustrating the device, the light receiving and driving circuit and the optical shutter are depicted by blocks labelled D/R and OS respectively which are combined by a connection line as illustrated in the upper part of FIG. 1. Further, another part producing a complementary output signal with respect to the first part is depicted by blocks labelled $\overline{DIR}$ and $\overline{OS}$ respectively. A plurality of thin film photo voltaic elements connected in series with each other is generally necessary to be able to produce a sufficient voltage for driving the optical shutter which, in this case, comprises a liquid crystal element. On the other hand, photo diodes are generally known as examples of the thin film photo voltaic element. In this embodiment, the thin film photo voltaic element may be composed of a plurality of photo diodes each having a photo receiving area smaller than the section of input light beam and are connected to form a plane, or of a plurality of thin film photo diodes each having a light receiving area almost the same as the section of the input light beam, and are stacked with each other in the direction of its thickness.

The liquid crystal elements 121 and 120 used as the optical shutter can be either of a type which transmits light when a voltage is applied thereto or a type which cuts off light when the voltage is applied thereto. The selection between these two types is possible by suitably selecting materials of a liquid crystal, manner of driving and direction of polarization of polarizing plate(s) which is disposed on one side or both (upper and lower) sides of the liquid crystal with electrodes. In this description, unless otherwise indicated, the liquid crystal is a twisted nematic type liquid crystal having polarizing plates disposed on both upper and lower sides of the liquid crystal with electrodes, with the polarization direction of polarizing plates being the same, which transmits light when a voltage is applied thereto, whereby confusion in explanation is avoided.

Figure 16:
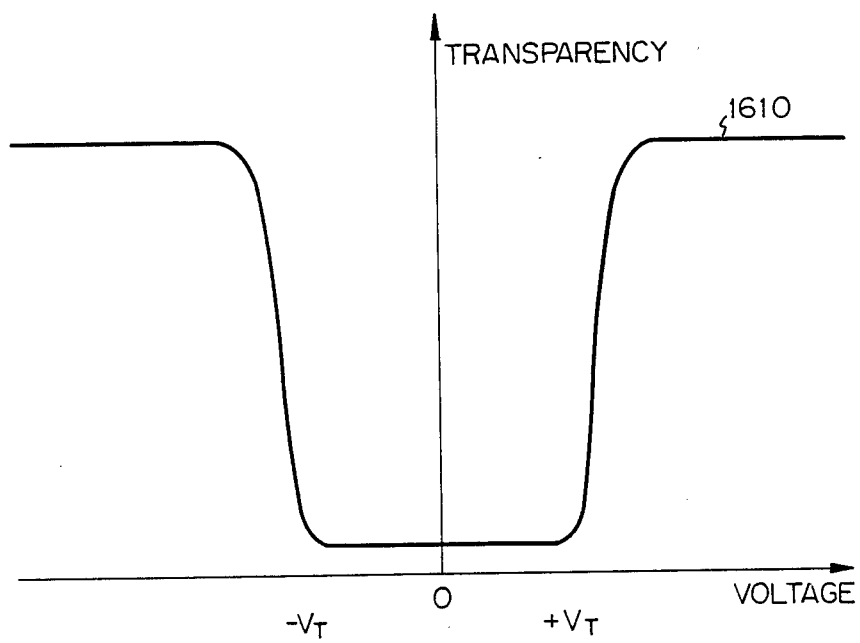
FIG. 16 is a characteristic diagram showing a shutter characteristic of a liquid crystal element.

FIG. 16 is an illustration of a typical example characteristic of such a liquid crystal element, in which the axis of abscissas indicates a voltage applied across upper and lower liquid crystal electrodes, and the axis of ordinates indicates a transmission rate obtained from intensity of light passed through the liquid crystal and standardized by intensity of incident light beam. As shown by a curved line 1610 in this figure, the characteristic of the liquid crystal element is such that the same transmission rate is obtained when absolute values of applied voltages are equal to each other, irrespectively of the polarity of the applied voltages. Furthermore, the transmission rate of the liquid crystal element raises steeply with an increase in the absolute value of the applied voltage after passing a threshold voltage $+V_T$ or $-V_T$, and it reaches a constant saturation value.

Turning back to FIG. 1, the operation of the device shown therein will be explained hereinafter.

As the input light, two sorts of lights, namely $h\nu i$ and $\overline{h\nu i}$ are used. When the light $h\nu i$ is stronger than the light $\overline{h\nu i}$, an output signal of the photo voltaic element 110 becomes superior to an output signal of the photo voltaic element 116, so that a positive voltage is applied to the liquid crystal element 120. In this expression, a potential at a lower electrode of the liquid crystal element 120 is taken as a base level, and a polarity of a potential at an upper electrode of the liquid crystal element 120 with respect to the base level is expressed as the polarity of the voltage applied to the liquid crystal element 120. Unless otherwise indicated, this is applied to other liquid crystal elements in the description.

With respect to the photo voltaic elements 117 and 113, an output signal of the photo voltaic element 117 becomes superior to an output signal of the photo voltaic element 113, so that a negative voltage near to zero is applied to the liquid crystal element 121. Therefore, the photo voltaic elements 110 and 116, and liquid crystal elements 120 and 121 are designed so that a voltage higher than $+V_T$ is applied to the liquid crystal element 120 and a voltage between $-V_T$ and 0 is applied to the liquid crystal element 121, the relation between light beams passing through the liquid crystal element 120 and the liquid crystal element 121 respectively becomes complementary.

If the input light $h\nu i$ is weaker than the input light $\overline{h\nu i}$, the operation of the device will be reversed at each point, and a light beam control mode of the optical shutters will be also reversed. In addition, since the light transmission rate of the liquid crystal element is dependent on the absolute value of the applied voltage as shown in FIG. 16, it is also possible to turn over the direction of diodes in the photo voltaic elements 110 and 116. Moreover, it is possible to omit the charge discharging resistors 111 and 114. In such an arrangement, even if the input light is in pulse form, the operation of the device can be extended to be longer than the period of pulse form input light provided that leak currents of the photo voltaic elements are small.

Figure 2:
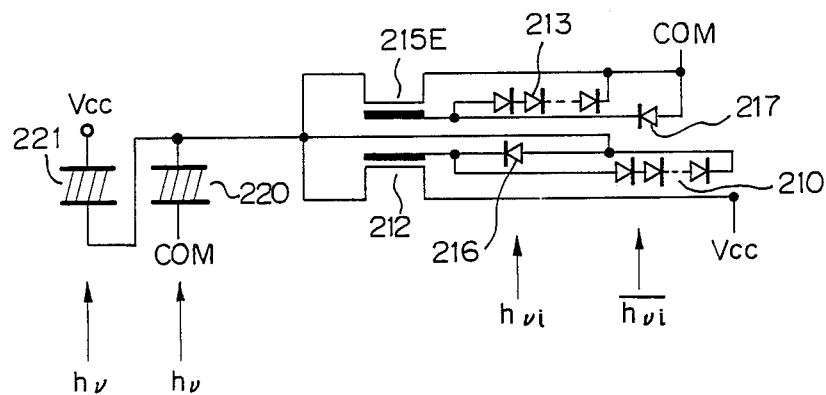
FIG. 2 is a circuit diagram of a second embodiment of a device using complementary input lights according to the present invention, in which optical shutters are driven by field effect transistors.

Turning to FIG. 2, a second embodiment will be explained. This embodiment is characterized in that the optical shutters are controlled by means of field effect transistors 212 and 215E. In this figure, the field effect transistors are assumed to be n-channel enhancement type field effect transistors.

As shown, optical shutters 220 and 221 are provided and connected in series with each other. A connection point between the optical shutters 220 and 221 is connected to field effect transistors 212 and 215E which are controlled by photo voltaic elements 210, 216, and 213, 217 respectively. When the input light $hvi$ is stronger than the input light $\overline{hvi}$, output signals of photo voltaic elements 216 and 213 become superior to output signals photo voltaic elements 210 and 217, the field effect transistor 212 will be shut off, while the field effect transistor 215E will be switched on. Therefore, a bias voltage of substantially zero is applied to the optical shutter 220 and a voltage of Vcc is applied to the optical shutter 220. In this way, the optical shutters 220 and 221 are able to control the transmission of light beams in a complementary manner.

On the other hand, when the input light $\overline{hvi}$ is stronger than the input light $hvi$, the field effect transistor 212 switches on, and the field effect transistor 215E is shut off. Therefore, the optical shutter 220 will be biased at the voltage Vcc.

The present invention will be further discussed with respect to another series of embodiments each forming an information processing unit which comprises photo receiving and driving circuits operating with more than two incident light beams and optical shutters controlled by the photo receiving and driving circuits, and in which optical shutters are driven by driving voltages obtained by logical processing of information carried by the more than two incident light beams.

Figure 3:
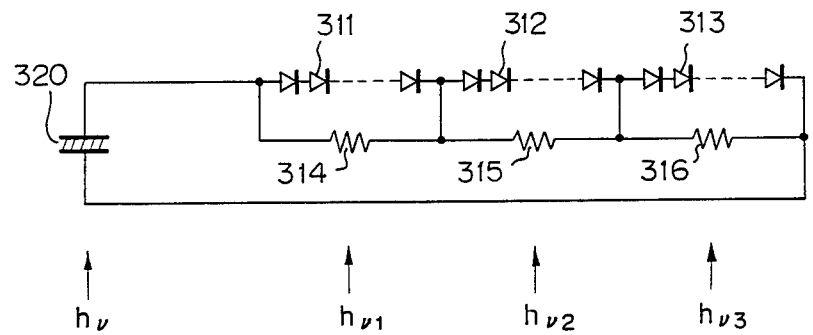
FIG. 3 is a circuit diagram of an embodiment of an AND circuit as one of logic circuits according to the present invention which carry out logical operations of information from more than two incident light beams.

Reference is now made to FIG. 3 which illustrates an embodiment of information processing unit constructed to have AND function, and adapted to receive three input lights $hv_1$, $hv_2$ and $hv_3$. This unit has three photo diode arrays 311 through 313 as photo voltaic elements, which are connected in series with each other. Three discharging resistors 314 through 316 are provided so that each is connected to a corresponding one of diode arrays 311 through 313. The unit further includes a liquid crystal element 320 which is electrically connected between an anode side terminal of the diode array 311 and a cathode side terminal of the diode array 313. When all of the photo diode arrays 311 through 313 receive incident lights, the voltage applied to the liquid crystal element 320 becomes equal to a positive voltage $V_A$ which is a sum of electromotive forces generated by the photo diode arrays 311 through 313. If any one of the diode arrays does not receive the incident light, the voltage applied to the liquid crystal element 320 becomes equal to a positive voltage $V_B$ which is lower than the voltage $V_A$ which is the sum of electromotive forces generated by the photo diode arrays which receive the incident lights. If the photo diode arrays 311 through 313 and the liquid crystal element 320 are designed to satisfy a condition of $V_A > V_T 22 V_B$ in which $V_T$ represents the reference voltage of the liquid crystal element having the characteristic of FIG. 16, the liquid crystal element 320 turns on as an optical shutter only when all of the photo diode arrays, i.e., three inputs, receive input lights. It is to be noted that the direction of each diode of the photo diode arrays 311 through 313 can be reversed, to obtain the same AND function. Furthermore, the discharging resistors 314 through 316 are effective to eliminate instability of the photo diodes in a high impedance state.

Figure 4:
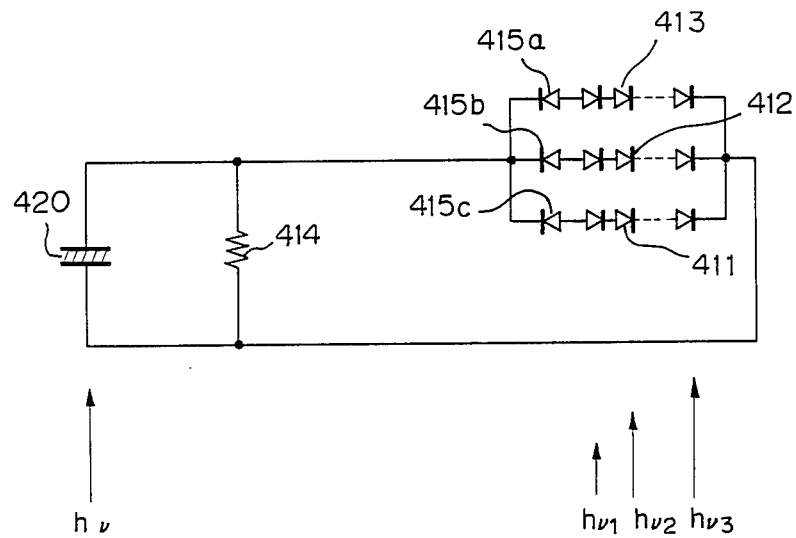
FIG. 4 is a circuit diagram of an embodiment of an OR circuit according to the present invention.

Turning to FIG. 4, an embodiment of a three input OR circuit will be described. In this embodiment, three photo diode arrays 411 through 413 as photo voltaic elements are provided and connected in a parallel manner, and a liquid crystal element 420 is connected across common ends of photo diode arrays 411 through 413. These photo diode arrays 411 through 413 are arranged to receive input lights $hv_1$ through $hv_3$ respectively. Furthermore, a discharging resistor 414 is connected across the liquid crystal element 420 and short-circuit current prevention diodes 415a through 415c are connected to a corresponding one of photo diode arrays 411 through 413, on the anode side thereof.

With this arrangement, if any one of photo diode arrays 411 through 413 receives an incident light, a positive voltage which is an electromotive force of the photo diode array receiving the incident light is applied to the liquid crystal element 420. On the other hand, if none of the photo diode arrays receives the incident light, the liquid crystal element 420 will be biased at almost 0 volt. Therefore, by designing the characteristic of photo diode arrays to generate an electromotive force higher than the reference level $V_T$ shown in FIG. 16, the construction of FIG. 4 can have a three input OR function. In addition, a discharging resistor 414 is connected in parallel to the liquid crystal element 420. As previously mentioned in connection with the description of the arrangement of FIG. 3, the direction of each diode of the photo diode arrays 411 through 413 and the short-circuit current preventing diodes 415a through 415c can be reversed, and the same OR function can be attained also in such a case.

Turning to FIGS. 5(a) through 5(d), embodiments respectively forming a NOT circuit will be explained.

Figure 5A:
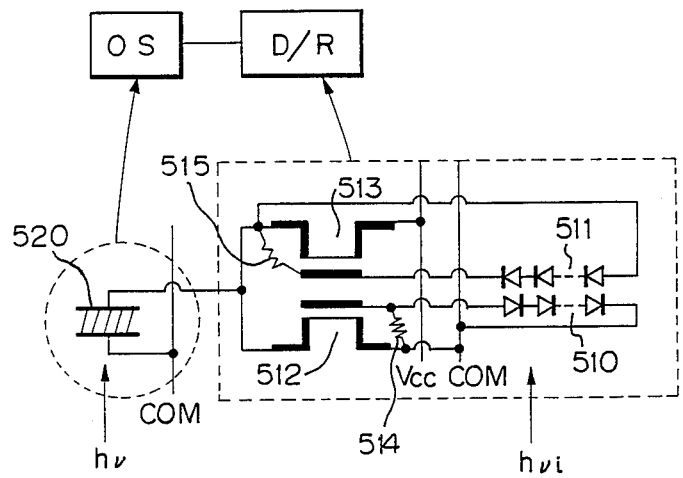
FIGS. 5(a), 5(b), 5(c) and are circuit diagrams showing embodiments of a NOT circuit according to the present invention respectively.

Reference is first made to FIG. 5(a) which illustrates a structure including an n-channel enhancement type field effect transistor 512 and an n-channel depletion type field effect transistor 513. Charge discharging resistors 514 and 515 are connected between the gate and the source of field effect transistors 512 and 513 respectively, and photo diode arrays 510 and 511 operating as the photo voltaic element are connected between the gate and the source of the field effect transistors 512 and 513 respectively. The photo diode array 510 includes a plurality of diodes which are connected in series with each other, so as to produce a voltage which is higher than a threshold voltage level of the field effect transistor 512. On the other hand, the photo diode array 511 includes a plurality of diodes connected in series with each other, so as to produce a voltage which is lower than a threshold voltage level of the depletion type field effect transistor 513.

When the incident light is applied to both of the photo diode arrays 510 and 511, the field effect transistor 512 switches on and the field effect transistor 513 is shut off. When the input light is turned off, the charge accumulated in the photo diode array 510 is discharged through the discharging resistor 514, so that the voltage across the gate and the source of field effect transistor 512 approaches zero, to shut off the field effect transistor 512. At the same time, the voltage between the gate and the source of the field effect transistor 513 returns to a zero bias level from a negative level, to switch on the field effect transistors 13. Therefore, the power voltage Vcc is applied to the liquid crystal element 520.

Figure 5B:
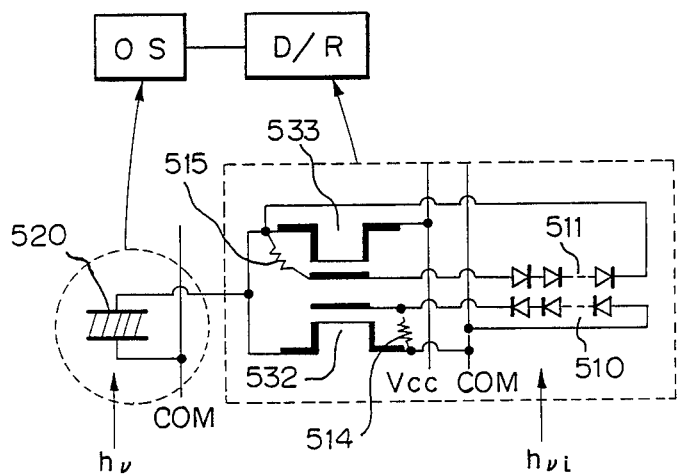

FIG. 5(b) illustrates another embodiment of the NOT circuit according to the present invention, in which a p-channel enhancement type field effect transistor 532 and a p-channel depletion type field effect transistor 533 are used and the direction of photo diodes of photo diode arrays as photo voltaic elements is reversed with respect to the embodiment of FIG. 5(a). It will be readily appreciated that the operation of this embodiment is identical to that of the previous embodiment shown in FIG. 5(a).

Figure 5C:
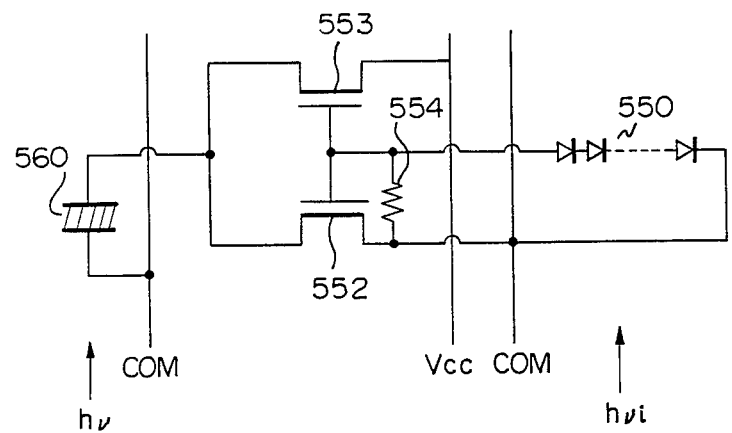

Turning to FIG. 5(c), a further embodiment of the NOT circuit will be explained. As shown, this embodiment has a CMOS structure which includes an n-channel enhancement type field effect transistor 552 and a p-channel enhancement type field effect transistor 553 having a common gate. A photo diode array 550 operating as the photo voltaic element is connected between the gate and the source of the field effect transistor 552, and a discharging resistor 554 is connected in parallel thereto. The photo diode array 550 includes a plurality of diodes connected in series with each other, so as to generate a voltage higher than the threshold level of the field effect transistor 552. The operation of this embodiment is the same as that of the previous embodiments shown in FIG. 5(a) and FIG. 5(b).

Figure 5D:
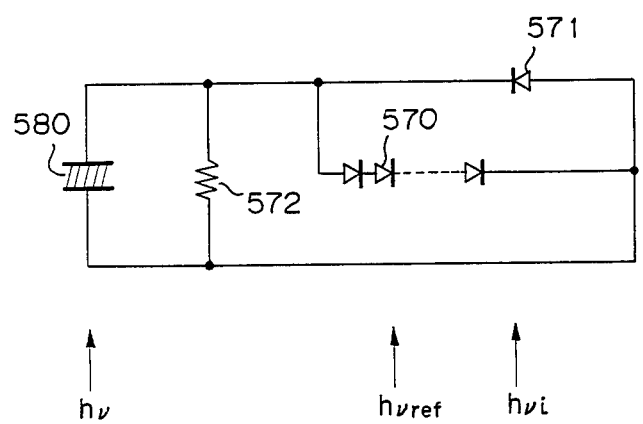

Turning to FIG. 5(d) a further embodiment of the NOT circuit according to the present invention will be explained. This embodiment of the NOT circuit includes only a photo diode array 570, a photo diode 571, both operating as a photo voltaic element, a discharging resistor 572, and a liquid crystal element 580. In other words, field effect transistors are not used in this embodiment and the diode array 570 includes a plurality of diodes connected in series with each other, and a reference light h ref is always applied to the diode array 570. When the intensity of an input light h$\nu$i is stronger than that of the reference light h$\nu$ref, an output signal of the photo diode 571 becomes superior to an output signal of the photo diode array 570, so that a negative voltage near to zero is applied to the liquid crystal element 580. When the intensity of the reference light h$\nu$ref is stronger than that of the input light h$\nu$i, the output signal of the photo diode array 570 becomes superior to the output signal of the photo diode 571, to apply a positive voltage to the liquid crystal element 580. Thus, the NOT circuit of this embodiment operates in a similar manner as the previous embodiments shown in FIGS. 5(a) through 5(c).

Figure 6:
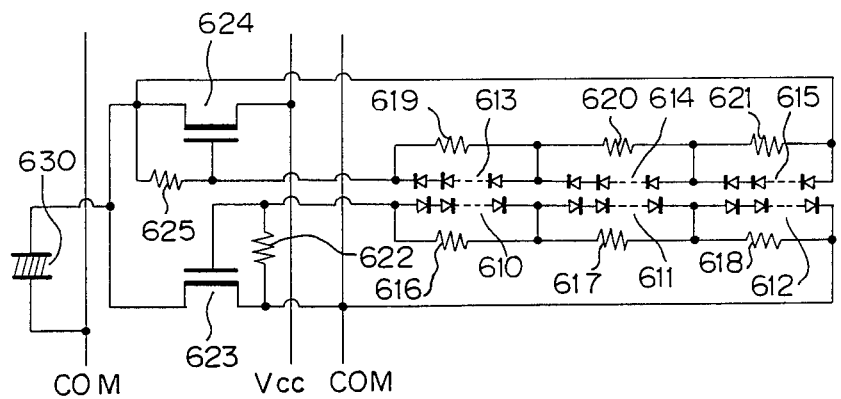
FIG. 6 is a circuit diagram of an embodiment of a NAND circuit according to the present invention.

FIG. 6 shows an example of NAND (NOT AND) circuit according to the present invention in which a plurality of photo diode arrays connected in series with each other are provided in the construction of FIG. 5(a). As illustrated, three photo diode arrays 610 through 612 operating as photo voltaic elements and connected in series with each other are connected between the gate and the source of a field effect transistor 623. Similarly, three photo diode arrays 613 through 615 operating as photo voltaic elements and connected in series with each other are connected between the gate and the source of a field effect transistor 624. A liquid crystal element 630 is connected to the field effect transistors 623 and 624 at a connection point between the drain of the field effect transistor 623 and the source of the field effect transistor 624. Discharging resistors 616 through 621 are connected to corresponding ones of diode arrays 610 through 615, and discharging resistors 622 and 625 are connected between the gate and the source of the field effect transistors 624 and 623 respectively. With this arrangement, a NAND function is performed.

Figure 7:
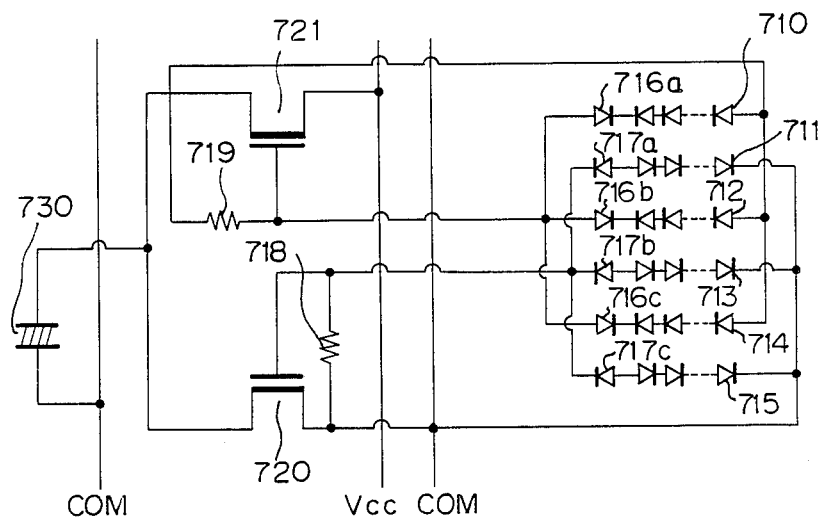
FIG. 7 is a circuit diagram of an embodiment of a NOR circuit according to the present invention.

Reference is now made to FIG. 7 in which an example of a NOR (NOT OR) circuit according to the present invention is illustrated. As shown, a plurality of diode arrays 710 through 715 operating as photo voltaic elements are provided and connected in a parallel manner. Moreover, short-circuit current preventing diodes 716a through 716c, 717a through 717c are connected in series with corresponding ones of diode arrays 710 through 715. Since the other portions are the same as the arrangement shown in FIG. 6, explanation thereof is omitted. With the arrangement shown in FIG. 7, a NOR function is performed. It will be appreciated that NAND and NOR circuits are composed by using a plurality of photo diode arrays and a basic arrangement shown in any one of FIGS. 5(b) through 5(d).

The complementary type construction of the devices explained so far can be directly connected to a logical operation of information carried by more than two incident lights. Embodiments of the present invention for performing such a logical operation will be explained hereinafter.

Figure 8:
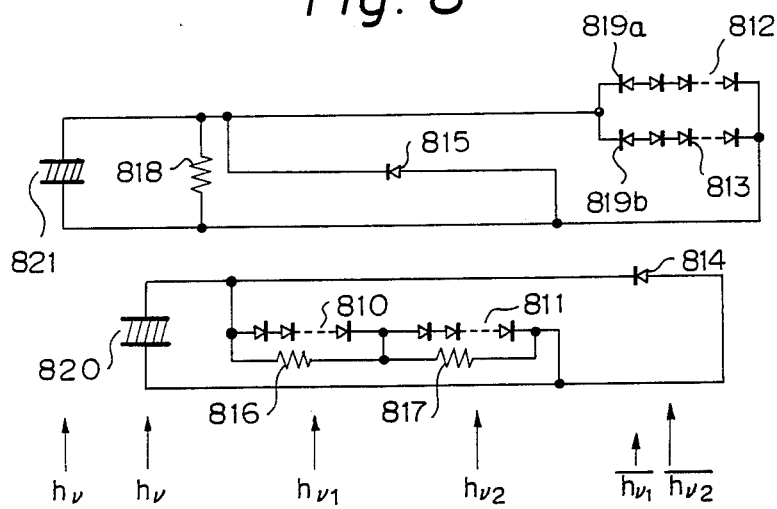
FIG. 8 is a circuit diagram of an embodiment of a complementary AND circuit according to the present invention, in which an AND function is given to the circuit shown in FIG. 1.

FIG. 8 shows an embodiment in which an AND function is obtained by means of a series connection of photo diode arrays each of which having the construction shown in FIG. 1, and by applying a plurality of independent light beams respectively to corresponding one of photo diode arrays. This embodiment uses two pairs of complementary input lights (h$\nu_1$, $\overline{h\nu_1}$) and (h$\nu_2$, $\overline{h\nu_2}$). When the input light h$\nu_1$ is stronger than the input light $\overline{h\nu_1}$ and at the same time the input light h$\nu_2$ is stronger than the input light $\overline{h\nu_2}$, a combined output signal of photo diode arrays 810 and 811 becomes superior to an output signal to a photo diode 814, so that a positive voltage is applied to a liquid crystal element 820. On the other hand, an output signal of a photo diode 815 becomes superior to a combined output signal of photo diode arrays 812 and 813, and a negative voltage near to zero is applied to a liquid crystal element 821. Therefore, the relation between the strength of light passing through the liquid crystal element 820 and the strength of light passing through the liquid crystal element 821 becomes complementary.

Conversely, if the input light $\overline{h\nu_1}$ is stronger than the input light h$\nu_1$ and at the same time the input light $\overline{h\nu_2}$ is stronger than the input light h$\nu_2$, relative magnitudes of output signals of the photo diodes will be reversed, to apply a negative voltage near to zero to the liquid crystal element 820 and a positive voltage to the liquid crystal element 821. Furthermore, when either of the input lights h$\nu_1$ and h$\nu_2$ is stronger than the input light $\overline{h\nu_1}$ or the input light $\overline{h\nu_2}$, the liquid crystal element 820 is biased at a substantially zero level, and the liquid crystal element 821 is biased at a positive level. Thus, light beam control modes of the liquid crystal elements will be always complementary. In addition, discharging resistors 816, 817 and 818 are connected across the terminals of diode arrays 810, 811 and liquid crystal element 821 respectively. Short circuit current preventing diodes 819a and 819b are connected in series with the diode arrays 812 and 813 respectively.

Figure 9:
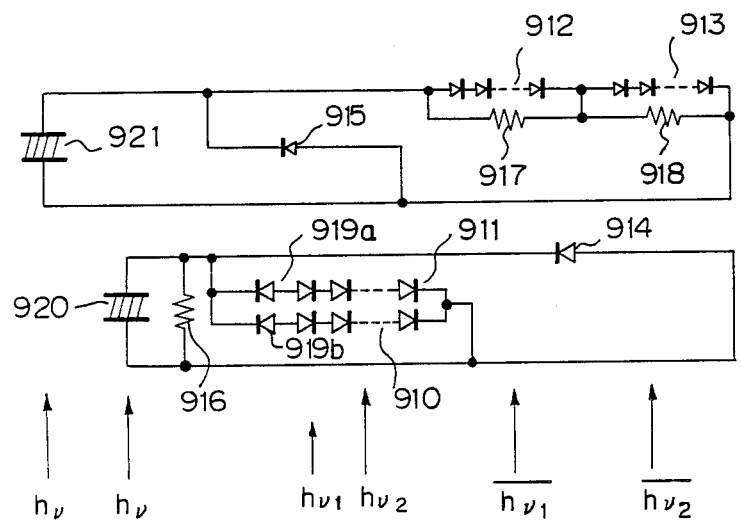
FIG. 9 is a circuit diagram of an embodiment of a complementary OR circuit according to the present invention, in which an OR function is given to the circuit shown in FIG. 1.

FIG. 9 shows an embodiment of the present invention in which two pairs of complementary input lights (hν₁, $\overline{h\nu}$(hν₂, $\overline{h\nu_2}$) and are also used, and an OR function is obtained. When the input light hν₁ is stronger than the input light $\overline{h_{841}}$, or when the input light hν₂ is stronger than the input light $\overline{h\nu_2}$, a combined output signal of photo diode arrays 910 and 911 becomes superior to an output signal of a photo diode 914, so that a positive voltage is applied to a liquid crystal element 920. Under this condition, an output signal of a photo diode 915 becomes superior to a combined output signal of photo diode arrays 912 and 913, so that a liquid crystal element 921 is biased at a substantially zero level. Therefore, the strengths of light beams passing through the liquid crystal elements 920 and 921 become complementary to each other. On the other hand, when the input light hν₁ is weaker than the input light $\overline{h\nu_1}$, and the input light hν₂ is weaker than the input light $\overline{h\nu_2}$, relative magnitudes of output signals of the photo diodes will be reversed with respect to the above explained relation, and the liquid crystal element 920 will be biased at a substantially zero level, and a positive voltage is applied to the liquid crystal element 921. In the circuit shown in FIG. 9, reference numerals 916, 917, and 918 denote discharging resistors connected across the terminals of the liquid crystal element 920 and the diode arrays 912 and 913 respectively, and the reference numerals 919a and 919b denote short circuit current preventing diodes connected in series with diode arrays 911 and 910 respectively.

In the above description of the preferred embodiments, it was assumed that the polarizing plates disposed sandwich the liquid crystal, i.e., a polarizing plate disposed on an upper electrode and a polarizing plate disposed below a lower electrode, have the same direction of polarization. However, it is also possible to use polarizing plates having directions of polarization which are perpendicular to each other. In such a case, it is obvious that operation modes of the liquid crystal elements will be reversed with respect to the case in which polarizing plates of the same direction of polarization are used. With polarizing plates of directions of polarization perpendicular to each other, the arrangement shown in FIG. 3 will have a NAND function, and the arrangement of FIG. 4 will have a NOR function. In the case of the arrangements shown in FIGS. 5(a) through 5(c), a NOT function can be obtained if the power voltage Vcc is applied to one of the electrodes of the liquid crystal element which is not connected to the field effect transistor instead of the common potential. If polarizing plates having perpendicular polarizing directions are to be used in the arrangement of FIG. 5(d), the NOT function can be obtained if the number of photo diodes is reversed between the photo diode array 570 and the photo diode 571, i.e, if a photo diode array having a plurality of photo diodes connected in series is used as the photo diode 571 and a photo diode is used in place of the photo diode array 570. However, as a more simple solution, a NOT circuit can be composed by the photo diode 571, the discharging resistor 572, and a liquid crystal element with polarizing plates having perpendicular polarizing directions, i.e. without using the reference light and the photo diode array 570.

Moreover, it is assumed that a dc power source is used to provide the power voltage Vcc in the above description of the embodiments. However, the arrangements of FIG. 2, FIGS. 5(a) and 5(b) can operate with a power voltage from an ac power source. In addition, an ac power current can be used in the arrangement of FIG. 1, if it is assumed that input lights hν_i and $\overline{h\nu}_i$ are complementary light pulses, and that the numbers of the photo voltaic elements 113 and 117 respectively, are made equal to each other and the numbers of the photo voltaic elements 110 and 116, respectively are made equal to each other.

Furthermore, in the above description of the embodiments, only two input or three input type AND circuits or OR circuit are explained. However, it is needless to say that more than four input type circuits can be constructed in the same manner.

Embodiments of the present invention which perform logical operations using the above described elements will be explained.

Figure 10:
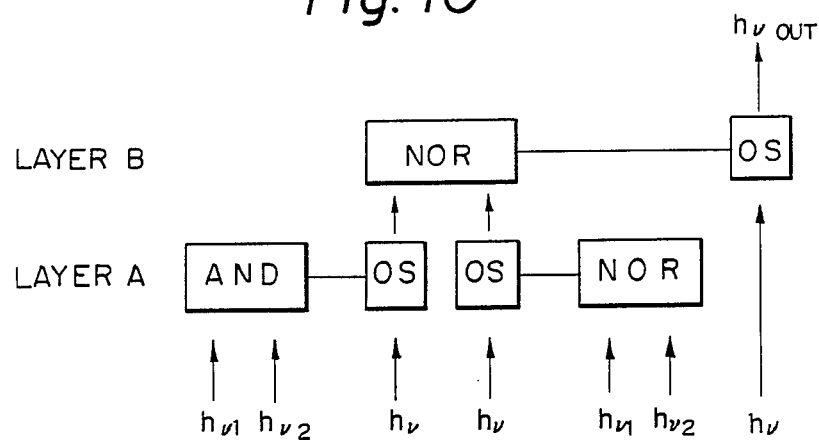
FIG. 10 is an explanatory block diagram of an embodiment of an arrangement to perform information processing according to the present invention, which shows an arrangement of elements forming a two input exclusive OR circuit.

FIG. 10 shows an embodiment of a two input exclusive OR (EXOR) circuit which is made up of an element having an AND function as illustrated in FIG. 3, and an element having a NOR function as illustrated in FIG. 7. As shown, an AND function element and a NOR function element are formed in a first layer A and arranged side by side. On the other hand, a second NOR function element is formed in a second layer B provided on the first layer A. Two input light hν₁ and hν₂ are used and each of optical shutters of the AND function element and the NOR function elements receives light beams indicated by hν. With this arrangement, an output light hνout obtained through an optical shutter of the second NOR function element becomes equal to zero when optical signal levels of the input lights hν₁ and hν₂ are equal to each other. In other cases, the optical shutter of the second NOR function element transmits the input light to provide the output light h out.

In the arrangement of FIG. 10, the AND element and the NOR element forming the first layer A can be built in the same panel because liquid crystals and polarizing plates for liquid crystal elements of the AND element and NOR element are of the same sort. Thus, the EXOR circuit according to the present invention can be constituted by two panels forming the above described layers A and B.

Figure 11:
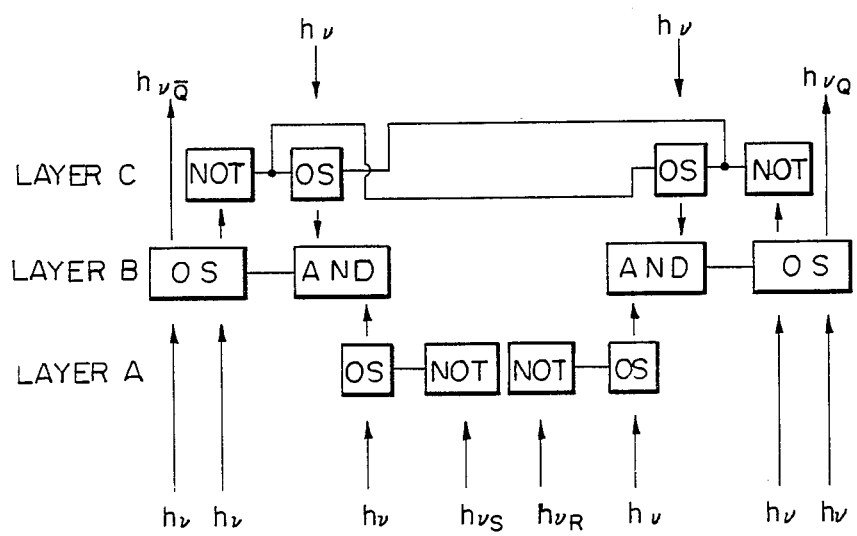
FIG. 11 is an explanatory block diagram similar to FIG. 10 showing an embodiment of a flip-flop circuit according to the present invention.

Turning to FIG. 11, an embodiment of the present invention forming a flip-flop circuit by combining AND function elements shown in FIG. 3 and NOT function elements shown in any one of FIGS. 5(a) through 5(d). Two NOT function elements are provided in a first layer A, and two AND function elements are provided in a second layer B formed on the first layer A. Furthermore, two NOT function elements are provided in a third layer C which is formed on the second layer B. Optical shutters of the AND function elements and the NOT function elements are supplied with light inputs hν which are irradiated not only from under the layer A but also from an opposite direction i.e., from above the layer C. In this way, a feedback of light signal is performed.

FIGS. 12(a) and 12(b) respectively show a plan view and a sectional view along a line A-B of an actual structure of a three input AND circuit such as shown in FIG. 3.

As shown in FIG. 12(a), thin film resistors made of hydrogenized amorphous silicon (a-Si:H) forming a P+ layer or an n+ the discharging resistors layer or an n layer is used as 314 through 316. As the photo voltaic elements 311 through 313, photo diodes made of a-Si:H forming a pin type structure. These elements are formed on one of a pair of glass substrates 1203 and 1204 sandwiching a liquid crystal 1205. A pair of polarizing plates 1201 and 1202 are disposed on outer sides of the substrates 1203 and 1204 respectively. A transparent electrode made of $SnO_2$ is provided between the substrate 1203 and the liquid crystal 1205, and an electrode made of ITO is provided between the liquid crystal 1205 and the upper substrate 1204. $SnO_2$ and ITO are also used as the material of wiring lines 1208.

Referring to the flowchart of FIG. 13, an example of manufacturing process for producing a structure as shown in FIGS. 12(a) and 12(b) will be explained. Most of the process is already established as a manufacturing process of an active element type liquid crystal plate which is, for example, described by S. Togashi et al., in Proc. of the Society for Information Display, 16 (1985). By this technique, it is relatively easy to form more than a hundred thousand diodes in a rectangular area having a size of 4 inches in the diagonal direction, and to form a liquid crystal panel including those diodes.

The embodiments of the present invention have been described so far on the assumption that liquid crystal is used as the optical shutter. This is because the liquid crystal optical shutter is driven by relatively low voltage power source, and it is suited for combining with photo diodes. However, liquid crystal inherently has a disadvantage that its speed of response is slow, and involves a problem of instability due to the use of a liquid material. Therefore, it is also conceivable to use a ferroelectric substance or a ultra sonic polarizing element in view of their high speed response characteristics and total solidness although the driving voltage thereof is higher than that of liquid crystal. For instance, the structure of PLZT (Lanthanum doped Lead Zirconate-Titanate), for example, by H. Franklin, Conference Record of the 1985 International Display Research Conference, P.37 (1985), which has been developed for display purposes can be used to replace the liquid crystal elements in the embodiments of FIGS. 1 through 11, to provide the same functions. Further, as liquid crystal elements, ferroelectric type liquid crystals having a high speed of response have been developed in recent years, and an optical shutter having a speed of the order of micro seconds can be produced by using a liquid crystal. Therefore more high speed logical operations can be realized by using this type of optical shutter.

For the information processing using the elements according to the present invention, a multistage structure must be used for the logical processing of information of input light beams, as typically shown in FIGS. 10 and 11. In the case of such a multistage structure, there can be a problem of attenuation of the strength of the input light, and the strength of light beams decreases as the logical operation proceeds to the later stage. If the input light is absorbed by the light receiving and driving circuit, its region will become unusable in planes of logical operations of later stages. This causes an increase of limitations in determining the arrangement of elements, making it difficult to raise the density of elements.

Figure 14:
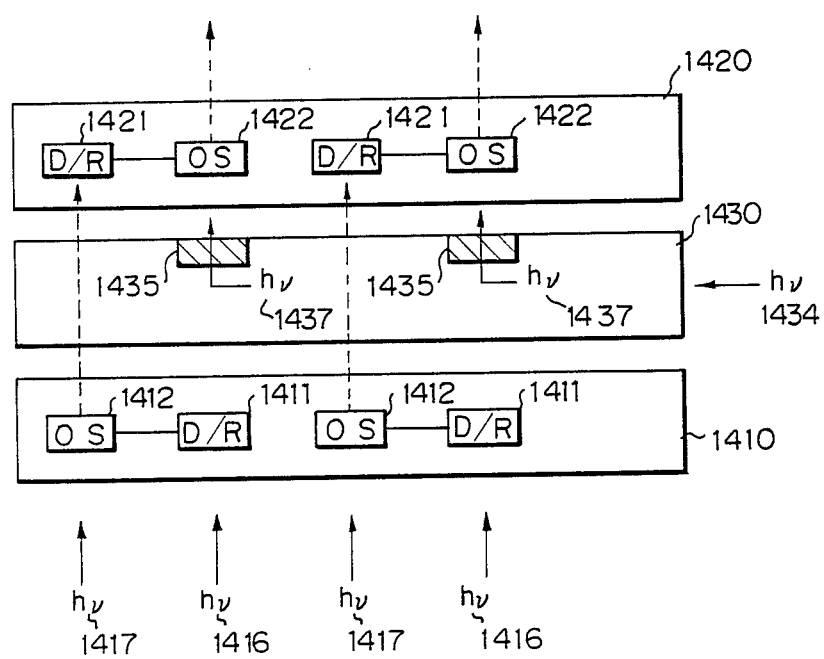
FIG. 14 is an explanatory block diagram of an embodiment according to the present invention, in which supply of light is performed.
Figure 15:
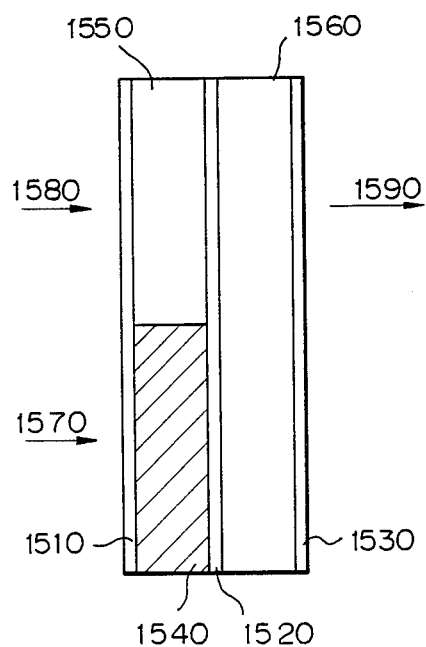
FIG. 15 is an explanatory diagram of a conventional device.

In order to avoid this problem, resupply of light is performed according to the present invention as typically illustrated in FIG. 14. As shown, a first panel 1410 containing combinations of a light receiving and driving circuit 1411 and an optical shutter 1412 having various logical functions as explained so far and a second panel 1420 including similar combinations are arranged in parallel with each other, and a light introducing plate 1430 as a light waveguide is inserted between them. A replenishing light 1434 is supplied to the light introducing plate from a side face thereof. A part of the replenishing light 1434 is extracted through light extracting parts 1435, and in turn introduced into the second panel 1420 as partial replenishing lights 1437. To extract the replenishing light, a physical structure such as a grating may be provided in the light extracting parts 1435. As another method, the light extracting parts 1435 may be formed to have a refractive index higher than that of the remaining part of the light introducing plate 1430, so that an operation which is the inverse of the light enclosing operation of an optical fiber will take place. Moreover, minute optical lenses can be provided as needed between the light introducing plate 1430 and the second panel 1420 in order to redress the extracted light.

In the thus constructed embodiment shown in FIG. 14, the efficiency of the device is greatly improved by arranging the light receiving and driving circuits 1411 and 1421, optical shutters 1412 and 1422, and light extracting part 1435 in a manner explained as follows.

Specifically, a light beam 1416 incident upon a light receiving and driving circuit 1411 of the first panel 1410 is absorbed therein and does not reach the second panel 1420. On the other hand, input light beams 1417 incident upon an optical shutter 1412 of the first panel 1410 are modulated thereby and in turn supplied to light receiving and drive circuits 1421 of the second panel 1420. With this structure, regions in the second panel 1420 located above the light receiving and driving circuits 1411 of the first panel 1410 receive no incident light and such regions of the second plate 1420 will be dead spaces which can not be utilized. Therefore, the light extracting parts 1435 of the light introducing plate 1430 are placed immediately above the light receiving and driving circuits 1411 of the first panel. Thus, as shown in FIG. 14, the optical shutters 1422 of the second panel 1420 can be provided by using the above mentioned dead spaces. This is quite advantageous in the system design. In addition, the direction of extraction of light from the light introducing plate 1430 may be either of the direction toward the first panel 1410 or the direction toward the second panel 1420. In the latter case, it is advantageous, for example, for utilization of the extracted lights for the feedback operations shown in FIG. 11 if the light extracting parts are provided directly above the optical shutters 1412 of the first panel 1410.

It will be appreciated from the foregoing, in the information processing device according to the present invention, almost all of problems encountered in conventional information processing device have been solved. Namely, by the information processing with complementary type input lights, possibilities of errors in logical operations due to various fluctuations, in the level of input lights can be by far reduced. Furthermore, various kinds of logical operations can be performed according to the present invention without any limitation substantially. To be more concrete, with conventional techniques, AND circuits having more than two inputs can not be made. With respect to OR circuits, output signal level does not become fixed. Furthermore, it is necessary to change the polarizing plate in the case of NOT and NOR circuits. Therefore, it is practically necessary to prepare different panels for AND circuits and/or circuits device in order to provide a high density logical operation device. In addition, it is necessary to combine a NOT circuit and an AND circuit for providing a NAND circuit. Furthermore, logical processing with complementary inputs is not possible.

Conversely, with the information processing device according to the present invention, none of the above limitations exist, making it possible to construct a very flexible and reliable logical operation system. If we take the case of an application of the arrangement for performing an exclusive OR function as shown in FIG. 10 in the pattern matching that of Seko as explained above, it is possible, in the information processing system according to the present invention, to supply an input image and a reference image simultaneously to the same panel including AND function elements and NOR function elements. On the other hand, with conventional information processing systems, it is disadvantageous that the AND function element and the NOR function element must be formed in different panels, and complete optical systems must be used for the purpose of the image input. Thus, the features of the present invention is very much advantageous as compared with the conventional techniques.

Furthermore, according to the present invention, optical shutters in each substrate can be controlled by previously applied electric input signals in addition to the input light beams. Therefore, a hybrid type information processing with electric signals and optical signals can be provided according to the present invention.

With the light replenishing operation of the present invention, a multistage logical operation can be easily performed by a three-dimensional laminated structure. Furthermore, since the dead space to which the supply of light is not possible is not produced, the limitations in arranging logical elements are by far reduced, thus a high density logical circuit can be constructed easily.

What is claimed is:

1. An optical shutter information processing device comprising:
  a plurality of photovoltaic elements arranged two-dimensionally and each of said photovoltaic elements generating a voltage upon receipt of a first incident light, light beam of said first incident light irradiating at least one of said photovoltaic elements which are interconnected with each other so as to produce at least one combined output signal: and
  one or more optical shutters arranged two-dimensionally and directly driven by said at least one combined output signal, each of said optical shutters receiving a light beam of a second incident light which is in parallel with said light beam of said first incident light, whereby said second incident light issues from said each of said optical shutters in the form of a light signal modulated at said each of said optical shutters.

2. An optical shutter information processing device comprising:
  one or more photovoltaic elements arranged two-dimensionally and each of said photovoltaic elements generating a voltage upon receipt of a first incident light, a light beam of said first incident light irradiating at least one of said photovoltaic elements which are interconnected with each other so as to produce at least one combined output signal;
  an electric power source generating an electric power output;
  at least one switching means controlled by said at least one combined output signal, for selectively directing said electric power output of said electric power source in response to said at least one combined output signal; and
  one or more optical shutters arranged two-dimensionally and driven by said electric power output supplied by said at least one switching means, each of said optical shutters receiving a light beam of a second incident light which is in parallel with said light beam of said first incident light, whereby said second incident light issues from said each of said optical shutters in the form of a light signal modulated at said each of said optical shutters.

3. A device according to claim 1 or claim 2, wherein said plurality of photovoltaic elements are interconnected in series, and directed to provide output voltages in the same polarity.

4. A device according to claim 1 or claim 2, wherein said plurality of photovoltaic elements are interconnected in parallel, and directed o provide output voltages in the same polarity.

5. A device according to claim 1 or claim 2, wherein said plurality of photovoltaic elements are pair of photovoltaic elements interconnected in parallel with each other, and directed to provide a pair of output voltages whose polarities are opposite to each other.

6. A device according to claim 1 or claim 2, wherein said plurality of photovoltaic elements are interconnected partly in series and partly in parallel. and directed to provide output voltages in the same polarity.

7. A device according to claim 1 or claim 2, wherein said plurality of photovoltaic elements are interconnected in parallel, and at least a pair of said plurality of photovoltaic elements are directed to provide two output voltages whose polarities are opposite to each other while other photovoltaic elements ar directed to provide output voltages in the same polarity.

8. A device according to claim 1 or claim 2, wherein said plurality of photovoltaic elements are arranged to form at least two branches connected in parallel with each other, said photovoltaic elements in at least one of said at least two branches are connected in series with each other and directed to provide output voltages in the same polarity, and at least one of said photovoltaic elements in other one of said at least two branches is directed to provide an output voltage whose polarity is opposite to said same polarity.

9. A device according to claim 1 or claim 2, wherein said one or more optical shutters are a pair of optical shutters, and said first incident light forms a pair of light beams whose strengths are in a complementary relation with each other and wherein strengths of lights issued from said pair of optical shutters are in a complementary relation with each other.

10. A device according to claim 1, wherein said first incident light has a plurality of light beams irradiating the same number of said photovoltaic elements respectively, and wherein said one or more optical shutters is a single optical shutter.

11. A device according to claim 10, wherein said plurality of photovoltaic elements are interconnected in series, and directed to provide output voltages in the same polarity, and wherein properties of said photovoltaic elements are selected so that a level of said combined output signal exceeds a threshold level for opening and closing said optical shutter only when all of said photovoltaic elements generate said output voltages respectively.

12. A device according to claim 10, wherein said plurality of photovoltaic elements are interconnected in parallel, and directed to provide output voltages in the same polarity, and wherein properties of said photovoltaic elements are selected so that a level of said combined output signal exceeds a threshold level for opening and closing said optical shutter only when at least one of said photovoltaic elements generates an output voltage.

13. A device according to claim 10, wherein said plurality of photovoltaic elements are a pair of photovoltaic elements interconnected in parallel to each other, and directed to provide a pair of output voltages whose polarities are opposite to each other, and wherein properties of said pair of photovoltaic elements are selected so that one of said pair of photovoltaic elements generates an output voltage whose level is higher than a threshold level for opening and closing said optical shutters and the other of said two photovoltaic elements generates an output voltage whose level is lower than said threshold level.

14. A device according to claim 2, wherein said switching means is a field effect transistor.

15. A device according to claim 1 or claim 2, wherein each of said photovoltaic elements is one or more photo diodes connected to each other.

16. A device according to claim 1 or claim 2, wherein said one or more optical shutters is one or more liquid crystal elements.

17. A device according to claim 1 or claim 2, wherein a plurality of panels, in each of which said photovoltaic elements and said optical shutters are combined in a two-dimensional arrangement, are stacked in a direction of said first and second incident lights to form a stack of panels, at least one of said first and second incident lights is irradiated from at least one of two main surfaces of said stack of panels; and a relative position of said panels is determined so that said photovoltaic elements in each of said panels receive, as said first incident light, one of (i) said incident light irradiated from said on of main surfaces of said stack of panels, transmitted through one of optical shutters in other one of said panels and (ii) said incident light irradiated from said one of main surfaces of said stack of panels, transmitted through a transparent part other than positions of said photovoltaic elements or said optical shutters, of said other one of said panels.

18. A device according to claim 1 or claim 2, wherein a plurality of panels, in each of which said photovoltaic elements and said optical shutters are combined in a two-dimensional arrangement, are stacked in a direction of said first and second incident lights to form a stack of panels:

planer light guides are inserted between said panels;

at least one of said first and second incident lights is irradiated from at least one of two main surfaces of said stack of panels, and a light beam is supplied to each of said planer light guides at a side face thereof, issuing said light beam from a part of a main surface of said each of said planer light guides in a direction of said first and second incident lights; and a relative position of said panels is determined so that said photovoltaic elements in each of said panels receive, as said first incident light, one of (i) said incident light irradiated from said one of main surfaces of said stack of panels, transmitted through one of optical shutters in other one of said panels and (ii) said incident light irradiated from said one of main surfaces of said stack of panels, transmitted through a transparent part, other than positions of said photovoltaic elements or said optical shutters, of said other one of said panels, and so that said one or more optical shutters in each of said panels receives, as said second incident light, one of (i) said incident light irradiated from said one of main surfaces of said stack of panels, transmitted through a transparent part, other than positions of said photovoltaic elements or said optical shutters, of said other one of said panels and (ii) said light beam from one of said planer light guides.

* * * * *